(12) United States Patent
Gutsche et al.

(10) Patent No.: US 6,420,099 B1
(45) Date of Patent: Jul. 16, 2002

(54) TUNGSTEN HARD MASK FOR DRY ETCHING ALUMINUM-CONTAINING LAYERS

(75) Inventors: Martin Gutsche, Dorfen (DE); Satish D. Athavale, Fishkill, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/366,132

(22) Filed: Aug. 2, 1999

(51) Int. Cl.[7] .......................... G03C 5/00; H01L 21/302
(52) U.S. Cl. ..................... 430/318; 430/311; 430/313; 216/51; 216/95; 216/100; 216/102; 216/105; 438/720
(58) Field of Search ................... 430/318, 316, 430/323, 311, 313; 216/51, 95, 100, 102, 105; 438/720

(56) References Cited

U.S. PATENT DOCUMENTS

| | | | | |
|---|---|---|---|---|
| 4,786,962 A | * | 11/1988 | Koch | 357/71 |
| 4,917,759 A | * | 4/1990 | Fisher et al. | 156/643 |
| 4,954,789 A | * | 9/1990 | Sampsell | 350/487 |
| 5,296,653 A | * | 3/1994 | Kiyota et al. | 174/250 |
| 5,635,763 A | * | 6/1997 | Inoue et al. | 257/763 |
| 5,693,567 A | * | 12/1997 | Weisfield et al. | 437/195 |
| 6,087,269 A | * | 7/2000 | Williams | 438/720 X |
| 6,097,094 A | * | 8/2000 | Ishigami | 257/763 |
| 6,156,485 A | * | 12/2000 | Tang et al. | 430/313 |
| 6,159,863 A | * | 12/2000 | Chen et al. | 438/720 |
| 6,174,819 B1 | * | 1/2001 | Shields et al. | 438/745 |
| 6,194,323 B1 | * | 2/2001 | Downey et al. | 438/717 |

FOREIGN PATENT DOCUMENTS

JP 5-136103 * 6/1993

OTHER PUBLICATIONS

Derwent 1993–210060, English abstract of JP 05–136103 issued Jun. 1, 1993.*
Pub. No. JP405136103A, English abstract of JP 05–136103A, issued Jun. 1, 1993, Copyright 1993, JPO and Japio.*
CA 119:172213, English abstract of JP 05–136103 issued in Jun. 1, 1993, copyright ACS 2000, from Chemical Abstracts online.*

* cited by examiner

Primary Examiner—Janet Baxter
Assistant Examiner—Amanda C. Walke

(57) ABSTRACT

A method for patterning an aluminum-containing layer. A tungsten-containing layer is provided over an aluminum-containing layer. The tungsten-containing layer is patterned to form an opening therein, so that the opening exposes an underlying portion of the aluminum-containing layer. The patterned tungsten-containing layer is exposed to an etch having a substantially higher etch rate of the aluminum-containing layer than of the tungsten-containing layer to remove the exposed portion of the aluminum-containing layer.

18 Claims, 3 Drawing Sheets

TUNGSTEN HARD MASK FOR DRY ETCHING ALUMINUM-CONTAINING LAYERS

BACKGROUND OF THE INVENTION

This invention relates to the formation of metallization layers during semiconductor processing.

As is known in the art, aluminum (Al) has long been the material of choice for back-end-of-the-line (BEOL) metallization. One approach for patterning aluminum is to use a photoresist mask to define individual features, such as lines and spaces. Then, portions of aluminum exposed by the photoresist mask are selectively removed by reactive ion etching (RIE). With shrinking device geometries, photoresist thicknesses have to be reduced to satisfy lithography requirements. At the same time, integration requirements tend to keep metallization layer thicknesses constant or even require an increase in the metal stack thickness to compensate for decreasing wire line width. These trends require improved etching methods.

More specifically, the etch chemistry for aluminum layers is typically based on chlorine, which creates a highly chemical etch environment. Upon completion of the aluminum etch, the photoresist is stripped. Sidewall polymers and fence-like residues (i.e., polymeric etch by-products formed on top of etched lines) sometimes remain. These sidewall polymers and fence-like residues are removed using an adequate wet clean, such as chromic phosphoric acid (CP), dilute sulfuric phosphoric acid (DSP), EKC (trade name of several solvents manufactured by EKC Technology, Inc.), or similar solvent.

A limitation of this patterning process employing photoresist arises for devices with sub-0.25 micron features which have metal stacks which are even higher than those used in previous generations. The photoresist will eventually not be able to withstand the etch processes required for higher metal stacks with shrinking device geometries.

Another limitation of photoresist-based etching processes is sidewall polymer. removal and corrosion control. During the etch, chlorine-containing polymer-like layers are formed on the sidewalls of etched features when chlorine reacts with the photoresist. Then, upon exposure to moisture, the chlorine on the wafer may give rise to serious corrosion problems.

An alternative approach to photoresist masks has been the implementation of a hard mask. Different dielectric materials have been suggested for a hard mask, such as $SiO_2$ or $Si_3N_4$. However, these materials are not conductive. Thus, after the metal lines are defined, the dielectric hard masks must be removed to enable contact to subsequent metallization layers. Also, anti-reflective coatings must be used for patterning the photoresist, to counteract the reflectivity of the aluminum which interferes with the definition of fine lines and spaces.

SUMMARY OF THE INVENTION

In accordance with one embodiment of the invention, a method is provided which includes providing a layer which contains aluminum. A tungsten (W)-containing layer is provided over the aluminum-containing layer. The tungsten-containing layer is patterned to form an opening therein, with the opening exposing an underlying portion of the aluminum-containing layer. The patterned tungsten-containing layer is then exposed to an etch having a substantially higher etch rate of the aluminum-containing layer than of the tungsten-containing layer to remove the exposed portion of the aluminum-containing layer. In some embodiments, the etch is a dry etch.

In accordance with another aspect of the invention, a metal stack is provided which includes a first refractory metal layer, a layer comprising aluminum over the first refractory metal layer, and a second refractory metal layer over the aluminum layer. A tungsten-containing layer is provided in contact with the second refractory metal layer, with the second refractory metal layer being of a material different from the tungsten-containing layer. A mask is provided over a selected region of the tungsten-containing layer, with the mask exposing an unmasked portion of the tungsten-containing layer. The mask is exposed to an etch, with the etch removing the unmasked portion of the tungsten-containing layer. Thereby, the tungsten-containing layer is formed into a hard mask for the underlying metal stack layer, with the hard mask exposing an underlying portion of the metal stack. A dry etch is brought into contact with the hard mask to selectively remove exposed portions of the underlying metal stack while leaving the hard mask substantially unetched.

In another aspect of the invention, a method is provided for patterning an aluminum-containing layer. The method includes providing the aluminum-containing layer with a tungsten-containing layer thereon. A mask is formed over the tungsten-containing layer with an opening in the mask. This opening exposes an underlying portion of the tungsten-containing layer. The mask is exposed to an etch having a substantially higher etch rate of the tungsten-containing layer than of the aluminum-containing layer to remove the exposed portion of the tungsten-containing layer and to expose an underlying portion of the aluminum-containing layer. The exposed portion of the aluminum-containing layer is exposed to an etch having a substantially higher etch rate of the aluminum-containing layer than of the tungsten-containing layer to remove the exposed portion of the aluminum-containing layer.

In accordance with another aspect of the invention, a method is provided for patterning an aluminum-containing layer, which includes depositing an aluminum-containing layer over a substrate. A tungsten-containing layer is deposited on the aluminum-containing layer. A mask is formed over the tungsten-containing layer with an opening in such mask exposing an underlying portion of the tungsten-containing layer. The mask is exposed to an etch which etches the tungsten-containing layer at a substantially higher etch rate than the aluminum-containing layer to pattern the tungsten-containing layer into a mask. This etch removes the exposed portion of the tungsten-containing layer and exposes an underlying portion of the aluminum-containing layer. Using the tungsten-containing mask, the exposed portion of the aluminum-containing layer is exposed to an etch having a substantially higher etch rate of the aluminum-containing layer than of the tungsten-containing mask to remove the exposed portion of the aluminum-containing layer.

Such a method provides one of more of the following advantages. A tungsten-containing mask makes possible the use of a thin initial masking layer, e.g. photoresist, because the latter needs to withstand only the etching of the tungsten-containing layer, and not the etching of the entire aluminum-containing layer. This method also allows one to etch thicker metal stacks, because one is not limited by the robustness of the initial masking layer, such as photoresist. Further, the tungsten-containing mask is conductive, so, unlike a dielectric hard mask, it does not need to be removed. Also, the tungsten-containing hard mask enables good electrical contact to subsequent layers. Moreover, improved reliability results are anticipated.

Embodiments may include one or more of the following. After an etch removes the unmasked portion of the tungsten-containing layer, thereby exposing an underlying portion of the metal stack, an exposed portion of the second refractory metal layer of the metal stack is removed with the same etch.

The tungsten-containing layer is etched in a fluorine-containing plasma. The fluorine-containing plasma contains $SF_6$. The aluminum-containing layer is etched in a chlorine-containing plasma. This plasma readily etches the aluminum-containing layer, while being highly selective to the tungsten-containing layer. This selectivity enables one to use the tungsten-containing layer as a mask, thereby eliminating the need to rely on any other mask for etching the aluminum-containing layer. The chlorine-containing plasma contains $BCl_3$. Forming a mask over the tungsten-containing layer includes forming a photoresist mask using photolithography. The photoresist mask is removed before the aluminum-containing layer is exposed to an etch. An advantage of removing the photoresist mask prior to the etch of the aluminum-containing layer is that the amount of organic polymers deposited during the aluminum etch is reduced, and fences are not formed. Thus, unlike with photoresist mask based etching of aluminum, control of sidewall-polymer-inducing gases such as $N_2$ is not critical. Also, since the organic polymers formed during dry etching of aluminum with a photoresist mask incorporate chlorine, the passivation layer consisting of these polymers must be removed to prevent the chlorine from corroding the metal. By eliminating the photoresist mask, a heavy passivation layer is not formed and one can use milder post-etch corrosion prevention methods.

The aluminum-containing layer is a structure of a layer of aluminum and a first layer of refractory metal, which, in some embodiments, includes a layer of titanium nitride (TiN) and/or titanium (Ti). The aluminum-containing layer also includes a second layer of refractory metal, so that the aluminum layer is sandwiched between the first and the second layer of refractory metal. The second layer of refractory metal includes a layer of Ti and/or TiN. The aluminum-containing layer includes aluminum containing copper and/or silicon and/or titanium.

In another aspect of the invention, a metallization layer for an integrated circuit is provided, including a first layer of refractory metal and an aluminum-containing layer disposed on the first layer of refractory metal. A second layer of refractory metal is disposed on the aluminum-containing layer, and a layer of tungsten is disposed on the second layer of refractory metal.

Embodiments may include some of the following. The first layer of refractory metal includes TiN and/or Ti. The second layer of refractory metal includes TiN and/or Ti. The aluminum-containing layer includes aluminum containing copper, silicon, or titanium.

Further aspects, features, and advantages will be found in the following.

DESCRIPTION OF THE PREFERRED EMBODIMENTS

Figure 1:
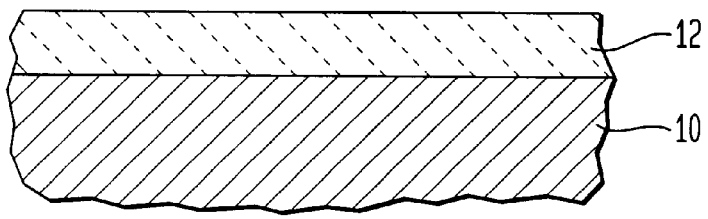
FIG. 1 is a cross-sectional view of a silicon substrate covered with a layer of silicon dioxide.
Figure 2:
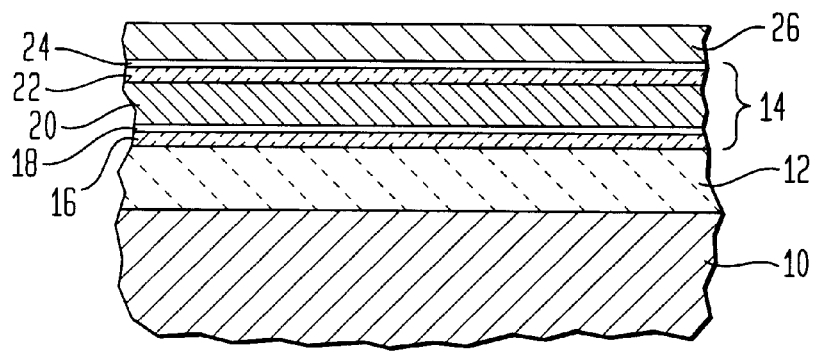
FIG. 2 is a cross-sectional view of the silicon substrate of FIG. 1, after the deposition of a metallization layer, including a tungsten hard mask.

Referring to FIG. 1, a Si substrate 10 is provided. A layer of dielectric 12, such as BPSG, is deposited onto the Si substrate 10 using a chemical vapor deposition (CVD) process. Next, referring to FIG. 2, an aluminum-containing metallization layer 14, approximately 400 nm thick, is deposited onto the dielectric layer 12, using techniques well known to those skilled in the art. The aluminum metallization layer 14 can comprise, for example, a sandwich structure of layers 16, 18, 20, 22, and 24 of TiN, Ti, AlCu, TiN, and Ti, respectively. The aluminum constituent 20 of the aluminum-containing metallization layer 14 may be pure aluminum. The aluminum may also contain additives of one or more of the following: copper, silicon, and titanium. A thin layer 26 of tungsten, here having a thickness less than 70 nm, is subsequently deposited onto the aluminum-containing metallization layer 14, with techniques well known to those skilled in the art.

Figure 3:
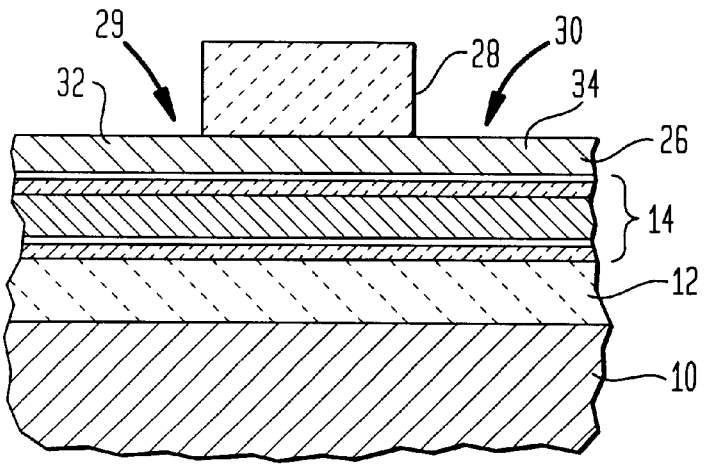
FIG. 3 is a cross-sectional view of the silicon substrate of FIG. 2, after the patterning of a photoresist layer.
Figure 4:
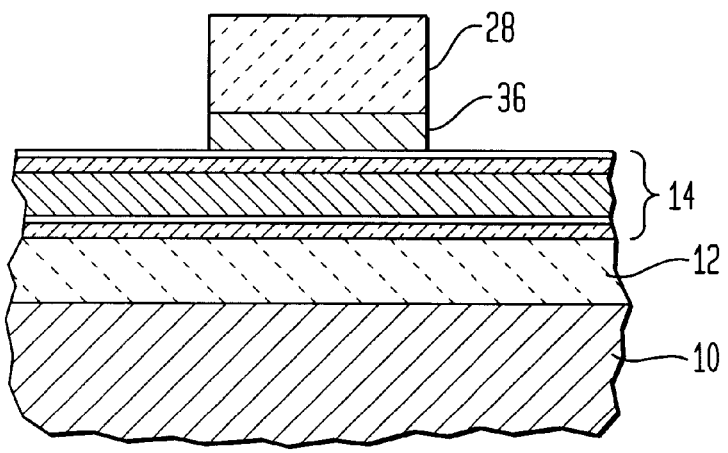
FIG. 4 is a cross-sectional view of the silicon substrate of FIG. 3, after the tungsten hard mask has been etched.

Referring to FIG. 3, the wafer 10 is coated with photoresist 28, which is subsequently patterned by using photolithography. An anti-reflective coating (ARC) is not necessary if tungsten layer 26 is thicker than approximately 200 nm because of the anti-reflecting properties of the tungsten layer 26. Openings 29 and 30 in the photoresist 28 expose portions 32 and 34 of the tungsten layer 26. The metal layers 14 and 26 are then patterned using separate reactive ion etch processes. Referring also to FIG. 4, the tungsten layer 26 is etched in a LAM transformer-coupled plasma (TCP) 9600 system (not shown), commercially available from LAM Research Corporation, 4670 Cushing Parkway, Fremont, Calif. 94538. The tungsten layer 26 is etched in a fluorine-containing plasma with the following parameters:

| | |
|---|---|
| pressure | 6–18 mTorr |
| source power | 500–800 watts |
| bias power | 20–60 watts |
| $SF_6$ | 50–150 sccm |
| $N_2$ | 20–50 sccm |
| wafer electrode temperature | 10–30 degrees C |
| He backside pressure | 5–10 Torr |
| time | 30 seconds for a 50 nm thick tungsten layer |

During the etch of the tungsten layer 26, the photoresist 28 acts as a mask and defines the portions of the tungsten layer 26 to be exposed to the plasma. More specifically, openings 29 and 30 defined by photoresist 28 expose portions 32 and 34 of tungsten layer 26. These portions 32 and 34 are etched in the fluorine-containing plasma. Etching of the tungsten layer 26 results in the definition of a tungsten hard mask 36.

Figure 5:
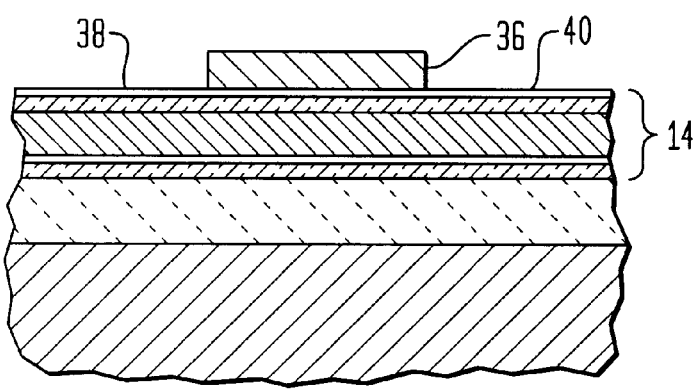
FIG. 5 is a cross-sectional view of the silicon substrate of FIG. 4, after the photoresist has been stripped.

After the tungsten hard mask 36 is opened, one has two options:

1) The photoresist 28 can be left in place. The photoresist 28 is then mostly consumed during the etch of the aluminum layer 14, and the tungsten hard mask 36 protects the features formed in the aluminum-containing layer 14 at the end of the etch step; or, 2) Referring to FIG. 5, in a preferred embodiment, the photoresist 28 is removed by stripping in an oxygen-containing plasma, after the tungsten hard mask 36 is etched and before the aluminum-containing layer 14 is etched. The photoresist 28 is stripped in a LAM DSQ (down-stream quartz) chamber. This chamber is on the same platform as the tungsten and aluminum etch chambers, but is separate from the latter two chambers. Alternatively, the resist 28 can be stripped in a stand-alone tool or another chamber on the same tool platform. The resist strip process parameters are:

| | |
|---|---|
| pressure | 800–1200 mTorr |
| $O_2$ | 800–1200 sccm |
| $H_2O$ | 250–350 sccm |
| power | 800–1200 watts |
| strip time | 30–100 seconds |

Figure 6:
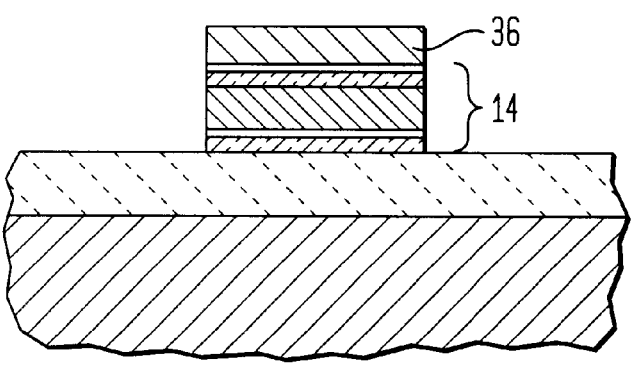
FIG. 6 is a cross-sectional view of the silicon substrate of FIG. 5, after the metallization layer has been etched.

Referring also to FIG. 6, regardless of whether or not the photoresist 28 is removed, the tungsten hard mask 36 is left in place to serve as a mask for etching the aluminum-containing metallization layer 14. The aluminum-containing metallization layer 14 is etched in a LAM TCP 9600 system using parameters in the following ranges:

| | |
|---|---|
| pressure | 6–18 mTorr |
| source power | 150–200 watts |
| bias power | 60–160 watts |
| $Cl_2$ | 30–100 sccm |
| $BCl_3$ | 4–8 sccm |
| wafer electrode temperature | 40–70 degrees C |
| He backside pressure | 5–10 Torr |
| time | etch step optically end-pointed followed by an overetch step with a duration which is a percentage, e.g. 30%, of the duration of the etch step before the optical end-point |

The aluminum-containing layer 14 is etched in a LAM TCP 9600 chamber separate from the chamber in which the tungsten layer 26 is etched. Although the two layers 14 and 26 may also be etched in the same chamber, this practice is not preferred because it may result in the formation of aluminum fluoride. Since aluminum fluoride is non-volatile, its presence may lead to particulate problems. The chlorine-containing plasma readily etches the exposed portions 38 and 40 of the aluminum-containing metallization layer 14, but its attack of the tungsten mask 36 is negligible. In fact, even at high bias power, experiments show that tungsten etch rates are below 100 nm/min, while aluminum etch rates in the same conditions are typically in the range of 800–1000 nm/min. Therefore, the etch rate of the aluminum is substantially higher than that of the tungsten, with an Al:W selectivity of more than 8:1. At low bias power, these values are expected to be even better, with even higher selectivity of aluminum to tungsten. The invention utilizes this etch selectivity by employing a tungsten hard mask for etching aluminum.

An advantage of the method of the invention is that photoresist 28 need not be present while the aluminum-containing layer 14 is etched. If the photoresist 28 is stripped, the tungsten mask 36 serves as a true hard mask during the entire etch of the aluminum-containing layer. The formation of chlorine-containing polymers is thereby greatly reduced, since there is no photoresist to react with the chlorine etchants. Therefore, unlike with photoresist-mask-based etching of aluminum, control of sidewall-polymer-inducing gases such as $N_2$ is not critical. Further, due to the high Al:W etch selectivty (>8.1), a thin tungsten mask (<70 nm) is sufficient to pattern an approximately 400 nm thick metal stack. Moreover, the thick sidewall passivation layer frequently observed in dry etching of aluminum with a photoresist mask must be subsequently removed to prevent the chlorine in this layer frqm corroding the metal. In the method of the invention, the absence of a heavy sidewall passivation layer paves the way to milder post etch corrosion prevention processing.

Figure 7:
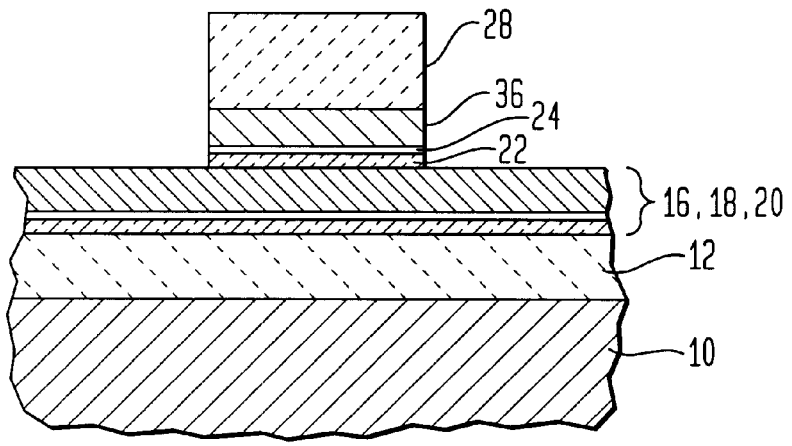
FIG. 7 is a cross-sectional view of the silicon substrate of FIG. 3, after the tungsten hard mask and a portion of the metallization layer have been etched.

Referring to FIG. 7, in an alternative embodiment, after the photoresist 28 is patterned, as illustrated in FIG. 3, the tungsten layer 26, as well as TiN and Ti layers 22 and 24 are etched in a fluorine-containing plasma in a LAM transformer-coupled plasma (TCP) 9600 system (not shown), with one of the following set of parameters:

Parameters A:

| | |
|---|---|
| pressure | 6–18 mTorr |
| source power | 500–800 watts |
| bias power | 40–120 watts |
| $SF_6$ | 50–150 sccm |
| $N_2$ | 20–50 sccm |
| wafer electrode temperature | 10–30 degrees C |
| He backside pressure | 5–10 Torr |
| time | 30 seconds for a 50 nm thick tungsten layer |

Parameters B:

| | |
|---|---|
| pressure | 6–18 mTorr |
| source power | 500–800 watts |
| bias power | 20–60 watts |
| $SF_6$ | 50–150 sccm |
| $N_2$ | 20–50 sccm |
| wafer electrode temperature | 10–30 degrees C |
| He backside pressure | 5–10 Torr |
| time | 75% overetch in addition to the time required to etch the tungsten layer |

It is noted that in order to etch refractory layers 22 and 24 in addition to tungsten layer 26, one must either double the bias power or increase the overetch step.

Figure 8:
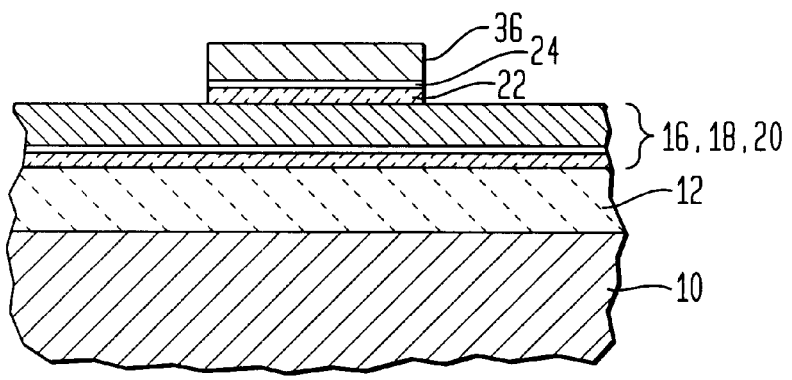
FIG. 8 is a cross-sectional view of the silicon substrate of FIG. 7, after the photoresist has been stripped.
Figure 9:
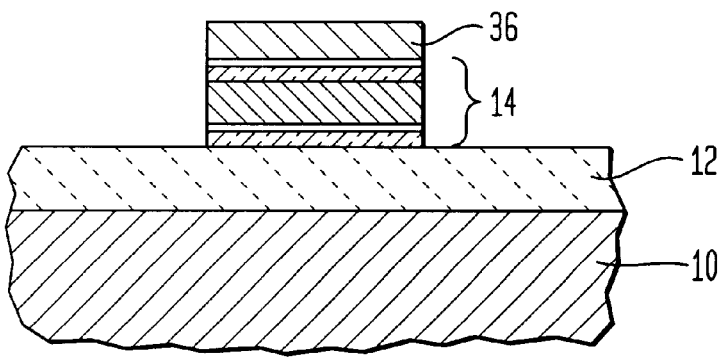
FIG. 9 is a cross-sectional view of the silicon substrate of FIG. 8, after the metallization layer has been completely etched.

Referring to FIG. 8, the photoresist 28 is stripped in the manner described above with reference to FIG. 5. Referring to FIG. 9, the layers 16, 18, and 20 of TiN, Ti, AlCu, are etched in the manner described above with reference to FIG. 6.

Many additional embodiments are possible. For example, the tungsten layer 26 may be a tungsten-containing layer with additives other than tungsten, such as tungsten nitride or tungsten suicide.

Other embodiments are within the following claims.

What is claimed is:

1. A method, comprising:
   providing a metal stack comprising a first refractory metal layer, a layer comprising aluminum over the first refractory metal layer, and a second refractory metal layer over the aluminum layer;

providing a tungsten-containing layer in contact with the second refractory metal layer, such second refractory metal layer being of a material different from the tungsten-containing layer;

providing a mask over a selected region of the tungsten-containing layer, such mask exposing an unmasked portion of the tungsten-containing layer;

exposing the mask to an etch, such etch removing the unmasked portion of the tungsten-containing layer and the second refractory metal layer, thereby forming the tungsten-containing layer into a hard mask for the underlying metal stack layer, such hard mask exposing an underlying portion of the aluminum layer; and bringing a dry etch into contact with the hard mask to selectively remove exposed portions of the underlying aluminum layer and first refractory metal layer while leaving the hard mask substantially unetched.

2. A method for patterning an aluminum-containing layer, comprising:

providing the aluminum-containing layer with a refractory metal layer thereon;

depositing a tungsten-containing layer onto the refractory metal layer, said refractory metal layer being of a different material from the tungsten-containing layer;

forming a mask over the tungsten-containing layer with an opening in such mask, such opening exposing an underlying portion of the tungsten-containing layer;

exposing the mask to an etch having a substantially higher etch rate of the tungsten containing layer than of the aluminum-containing layer and under such etch conditions so as to remove the exposed portion of the tungsten-containing layer and the refractory metal layer and to expose an underlying portion of the aluminum-containing layer; and exposing the exposed portion of the aluminum-containing layer to an etch having a substantially higher etch rate of such aluminum-containing layer than of the tungsten-containing layer to remove such exposed portion of the aluminum-containing layer.

3. A method for patterning an aluminum-containing layer, comprising:

depositing a metallization layer over a substrate, said metallization layer comprising a first refractory metal layer, an aluminum-containing layer, and a second refractory metal layer;

depositing a tungsten-containing layer on the second refractory metal layer;

forming a mask over the tungsten-containing layer with an opening in such mask exposing an underlying portion of the tungsten-containing layer;

exposing the mask to an etch which etches the tungsten-containing layer and the second refractory metal layer to pattern such tungsten-containing layer into a mask, wherein such etch removes the exposed portion of the tungsten-containing layer and the second refractory metal layer and exposes an underlying portion of the aluminum-containing layer; and using the tungsten-containing mask, exposing the exposed portion of the aluminum-containing layer to an etch having a substantially higher etch rate of said aluminum-containing layer than of the tungsten-containing mask to remove said exposed portion of the aluminum-containing layer and the first refractory metal layer.

4. The method of claim 3, wherein the tungsten-containing layer is etched in a fluorine-containing plasma.

5. The method of claim 4, wherein the fluorine-containing plasma contains $SF_6$.

6. The method of claim 3, wherein the aluminum-containing layer is etched in a chlorine-containing plasma.

7. The method of claim 6, wherein the chlorine-containing plasma contains $BCl_3$.

8. The method of claim 3, wherein forming a mask over the tungsten-containing layer comprises forming a photoresist mask using photolithography.

9. The method of claim 8, further comprising removing the photoresist mask before exposing the aluminum-containing layer to an etch.

10. The method of claim 3, wherein the first layer of refractory metal comprises a layer of TiN.

11. The method of claim 10, wherein the first layer of refractory metal further comprises a layer of Ti.

12. The method of claim 3, wherein the first layer of refractory metal comprises a lower layer of TiN and an upper layer of Ti.

13. The method of claim 12, wherein the second layer of refractory metal comprises a lower layer of TiN and an upper layer of Ti.

14. The method of claim 3, wherein the second layer of refractory metal comprises a layer of TiN.

15. The method of claim 14, wherein the second layer of refractory metal further comprises a layer of Ti.

16. The method of claim 3, wherein the aluminum-containing layer comprises aluminum containing copper.

17. The method of claim 3, wherein the aluminum-containing layer comprises aluminum containing silicon.

18. The method of claim 3, wherein the aluminum-containing layer comprises aluminum containing titanium.

* * * * *